United States Patent
Nakamura

(10) Patent No.: US 11,329,627 B2
(45) Date of Patent: May 10, 2022

(54) FILTER AND MULTIPLEXER

(71) Applicant: Murata Manufacturing Co., Ltd., Nagaokakyo (JP)

(72) Inventor: Shinichi Nakamura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/898,584

(22) Filed: Jun. 11, 2020

(65) Prior Publication Data

US 2020/0412334 A1    Dec. 31, 2020

(30) Foreign Application Priority Data

Jun. 28, 2019 (JP) .............................. JP2019-120733

(51) Int. Cl.
| | |
|---|---|
| *H03H 9/70* | (2006.01) |
| *H03H 9/54* | (2006.01) |
| *H03H 9/205* | (2006.01) |

(52) U.S. Cl.
CPC ............ *H03H 9/542* (2013.01); *H03H 9/205* (2013.01); *H03H 9/70* (2013.01)

(58) Field of Classification Search
CPC ........... H03H 9/542; H03H 9/205; H03H 9/70
See application file for complete search history.

(56) References Cited

U.S. PATENT DOCUMENTS

| | | | | |
|---|---|---|---|---|
| 9,219,467 | B2 * | 12/2015 | Inoue ....................... | H03H 9/54 |
| 9,966,929 | B2 * | 5/2018 | Takamine ............ | H03H 9/0576 |
| 10,135,422 | B2 * | 11/2018 | Goto .................... | H03H 9/6483 |
| 2014/0113571 | A1 * | 4/2014 | Fujiwara ............. | H03H 9/6433 |
| | | | | 455/73 |
| 2018/0152191 | A1 | 5/2018 | Niwa et al. | |

FOREIGN PATENT DOCUMENTS

| | | |
|---|---|---|
| JP | 2002-064358 A | 2/2002 |
| JP | 2018-088678 A | 6/2018 |

* cited by examiner

*Primary Examiner* — Dinh T Le

(57) ABSTRACT

A filter includes a transmission filter circuit and an additional circuit that is electrically connected in parallel with at least a portion of the transmission filter circuit. The additional circuit includes a resonator group including a plurality of interdigital transducer electrodes provided adjacent to or in a vicinity of each other in an acoustic wave propagation direction, a first capacitive element electrically connected between the resonator group and one end of the additional circuit, and a second capacitive element connected between a ground and a signal path electrically connecting the resonator group and the first capacitive element. A capacitance of the second capacitive element is greater than about 0 pF and less than or substantially equal to about 2.0 pF.

15 Claims, 3 Drawing Sheets

FILTER AND MULTIPLEXER

CROSS REFERENCE TO RELATED APPLICATIONS

This application claims the benefit of priority to Japanese Patent Application No. 2019-120733 filed on Jun. 28, 2019. The entire contents of this application are hereby incorporated herein by reference.

BACKGROUND OF THE INVENTION

1. Field of the Invention

The present invention relates to a filter and a multiplexer each including an additional circuit.

2. Description of the Related Art

A filter has been known which includes a ladder circuit and a loop circuit connected between two different points on a signal path extending from the input portion to the output portion of the ladder circuit (see, for example, Japanese Unexamined Patent Application Publication No. 2018-88678).

The loop circuit is a circuit that cancels the phase of a signal between the two different points in the ladder circuit. The loop circuit partly attenuates a signal in the stop band of the filter by the phase canceling. As a result, the attenuation characteristics of the filter and the isolation characteristics of a multiplexer including the filter are improved. The loop circuit corresponds to an additional circuit in this specification.

The loop circuit (additional circuit) disclosed in Japanese Unexamined Patent Application Publication No. 2018-88678 includes a longitudinally coupled filter, a first capacitor disposed between the longitudinally coupled filter and the input portion, and a second capacitor disposed between the longitudinally coupled filter and the output portion.

With the wider frequency band of a filter as a backdrop, it is sometimes difficult for an additional circuit in the related art to adequately improve attenuation characteristics and isolation characteristics.

SUMMARY OF THE INVENTION

Preferred embodiments of the present invention provide significantly improved attenuation characteristics and isolation characteristics in filters and multiplexers each including an additional circuit.

A filter according to a preferred embodiment of the present invention includes a filter circuit and an additional circuit. The additional circuit is electrically connected in parallel with at least a portion of the filter circuit and includes a resonator group including a plurality of interdigital transducer (IDT) electrodes provided adjacent to or in a vicinity of each other in an acoustic wave propagation direction, a first capacitive element electrically connected between the resonator group and one end of the additional circuit, and a second capacitive element electrically connected between a ground and a signal path electrically connecting the resonator group and the first capacitive element. A capacitance of the second capacitive element is greater than about 0 pF and less than or equal to about 2.0 pF.

A multiplexer according to a preferred embodiment of the present invention includes a first filter and a second filter. One end of the first filter is electrically connected to one end of the second filter. At least one of the first filter and the second filter is the above-described filter.

In a filter according to a preferred embodiment of the present invention, the additional circuit generates a signal (hereinafter referred to as a cancellation signal) that is in opposite or substantially opposite phase to a cancellation target signal leaked from the filter circuit and preferably has the same or substantially the same amplitude as the cancellation target signal. In the entire filter including the additional circuit and the filter circuit, the amplitude of the cancellation target signal is significantly reduced and attenuation characteristics and isolation characteristics are significantly improved.

Since the above-described additional circuit is able to control the amplitude of the cancellation signal with not only the first capacitive element but also the second capacitive element, the amplitude of the cancellation signal is able to be more appropriately controlled as compared with the case where an additional circuit in the related art does not include the second capacitive element. By providing a cancellation signal the amplitude of which is more appropriately controlled, the amplitude of the cancellation target signal is able to be more significantly reduced.

As a result, filters and multiplexers each having excellent attenuation characteristics and excellent isolation characteristics are able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the respective preferred embodiments and drawings. The preferred embodiments to be described below represent comprehensive or concrete examples. The numerical values, shapes, materials, components, the arrangement and connection configuration of the components to be described in the following preferred embodiments are merely illustrative, and are not intended to limit the present invention. In the following preferred embodiments, the expression of "being connected" means not only that components are directly connected to each other by a wiring conductor but also that the components are electrically connected to each other via another circuit element.

As examples of filters according to preferred embodiments of the present invention and multiplexers according to preferred embodiments of the present invention, a transmission filter including an additional circuit and a duplexer including the transmission filter and a reception filter will be described.

First, the basic structure and operations of a filter and a multiplexer each including an additional circuit, which is the same as or similar to the loop circuit disclosed in Japanese Unexamined Patent Application Publication No. 2018-88678, will be described. Subsequently, the distinctive structure and advantageous effects of filters according to preferred embodiments of the present invention and multiplexers according to preferred embodiments of the present invention will be described.

Figure 1:
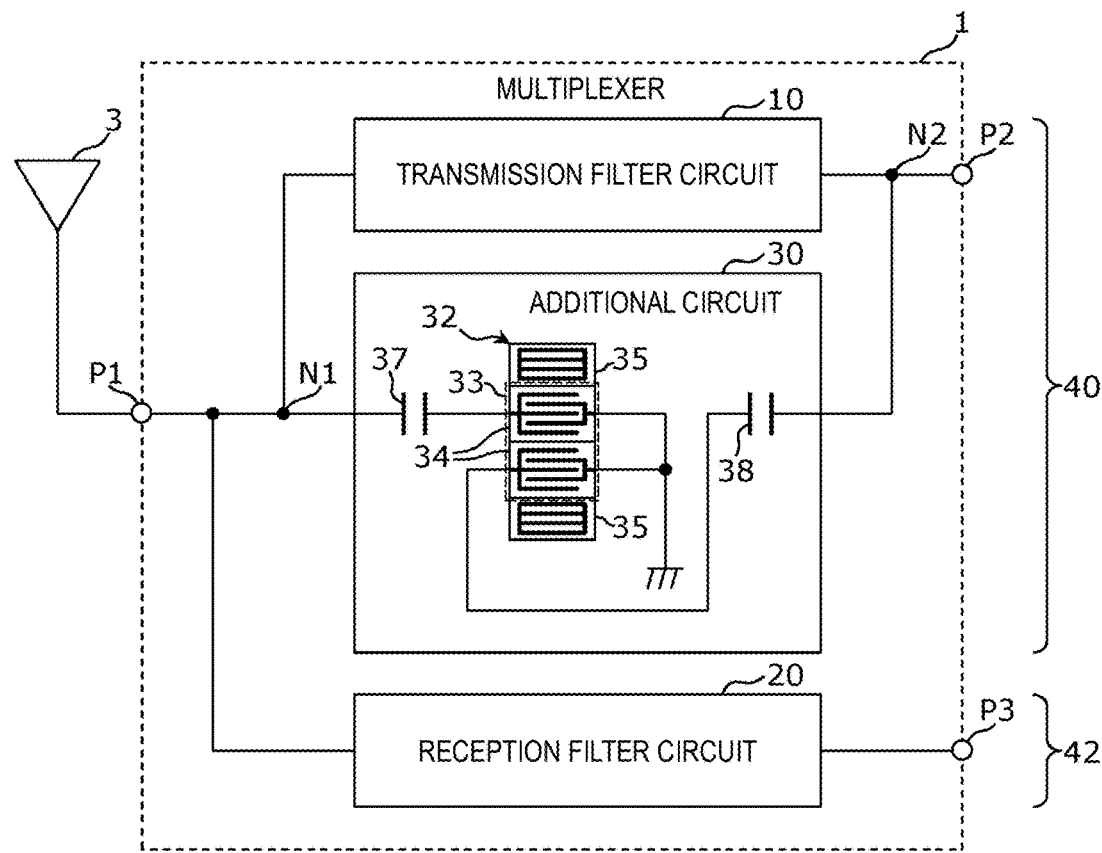
FIG. 1 is a block diagram showing a multiplexer.

FIG. 1 is a block diagram showing a multiplexer including an additional circuit that is the same as or similar to a loop circuit in the related art. As shown in FIG. 1, a multiplexer 1 includes terminals P1, P2, and P3, a transmission filter circuit 10, a reception filter circuit 20, and an additional circuit 30. The terminal P1 is connected to an antenna 3.

The transmission filter circuit 10 is provided between the terminals P1 and P2. One end and the other end of the transmission filter circuit 10 may be directly connected to the terminals P1 and P2, respectively or may be connected to them via other circuit elements (not shown). Although not particularly limited, the transmission filter circuit 10 may be, for example, an acoustic wave filter including an acoustic wave resonator or an LC resonator filter including an inductor and a capacitor.

The reception filter circuit 20 is provided between the terminals P1 and P3. One end and the other end of the reception filter circuit 20 may be directly connected to the terminals P1 and P3, respectively or may be connected to them via other circuit elements (not shown). Although not particularly limited, the reception filter circuit 20 may be, for example, an acoustic wave filter including an acoustic wave resonator or an LC resonator filter including an inductor and a capacitor.

The additional circuit 30 is connected in parallel with at least a portion of the transmission filter circuit 10. Between the terminals P1 and P2, one end and the other end of the additional circuit 30 are connected to nodes N1 and N2, respectively, on a signal path including the transmission filter circuit 10. The nodes N1 and N2 may be located between the transmission filter circuit 10 and the terminal P1 and between the transmission filter circuit 10 and the terminal P2, respectively. The nodes N1 and N2 may be in the transmission filter circuit 10. Accordingly, at least one circuit element is connected to the signal path between the terminal P1 and the node N1 or the signal path between the terminal P2 and the node N2.

The additional circuit 30 includes a resonator group 33 and capacitive elements 37 and 38.

The resonator group 33 includes two IDT electrodes 34 provided adjacent to or in a vicinity of each other in an acoustic wave propagation direction (for example, the top-bottom direction in FIG. 1). One of the two IDT electrodes 34 includes one end connected to the node N1 via the capacitive element 37 and the other end connected to a ground electrode. The other one of the two IDT electrodes 34 includes one end connected to the node N2 via the capacitive element 38 and the other end connected to the ground electrode. The number of the IDT electrodes 34 is not limited to two, and may be three or more (not shown).

The resonator group 33 and reflectors 35 provided on either side of the resonator group 33 in the acoustic wave propagation direction define a longitudinally coupled resonator 32 to transmit a signal by the coupling of acoustic waves. The resonator group 33 may define not only a longitudinally coupled resonator but also a transversal filter. The transversal filter may include an acoustical material (not shown) instead of the reflectors 35.

The capacitive element 37 is connected between the resonator group 33 and the node N1. The capacitive element 38 is connected between the resonator group 33 and the node N2.

The resonator group 33 controls the phase of a signal passing through the additional circuit 30. The capacitive elements 37 and 38 control the amplitude of a signal passing through the additional circuit 30. The additional circuit 30 generates a signal (that is, a cancellation signal) that is to be cancelled out by a cancellation target signal leaked from the transmission filter circuit 10 (for example, a signal component in a reception band).

The amplitude of a result of the combination of the cancellation signal and the cancellation target signal component is smaller than that of the cancellation target signal component. The cancellation signal is in opposite or substantially opposite phase to the cancellation target signal component, and preferably has the same or substantially the same amplitude as the cancellation target signal component.

The cancellation target signal component and the cancellation signal are in opposite or substantially opposite phase to each other, and the absolute value of the phase difference between the cancellation target signal component and the cancellation signal is greater than about 90° in the range of about −180° to about 180°. The cancellation target signal component and the cancellation signal have phase components in opposite or substantially opposite directions.

The cancellation signal preferably has the same or substantially the same amplitude as the cancellation target signal component, but may have a different amplitude. When the amplitude of a result of the combination of the cancellation signal and the cancellation target signal component is smaller than that of the cancellation target signal component based on the phase difference between them, attenuation characteristics are able to be significantly improved.

The transmission filter circuit 10 and the additional circuit 30 define a transmission filter 40. The reception filter circuit 20 defines a reception filter 42. The transmission filter 40 and the reception filter 42 define a duplexer that demultiplexes and multiplexes a transmission signal and a reception signal.

Next, the basic structure of a longitudinally coupled resonator 32 will be described.

Figure 2:
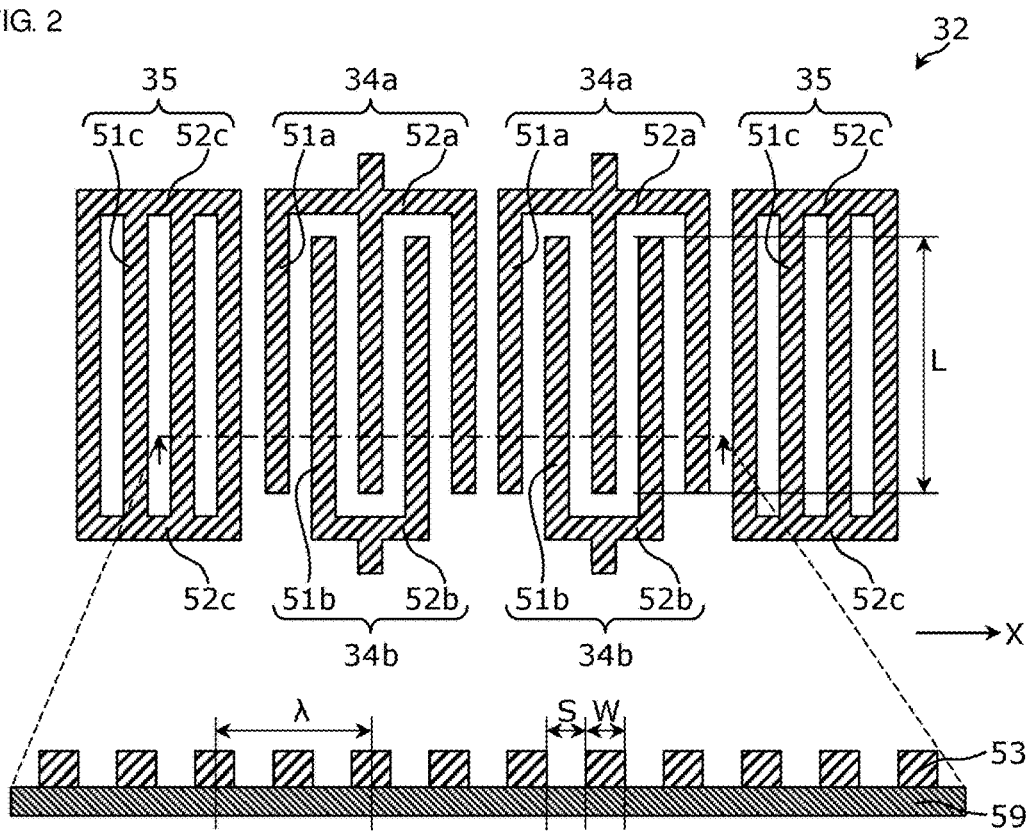
FIG. 2 is a plan view and a cross-sectional view of a longitudinally coupled resonator which show the longitudinally coupled resonator.

FIG. 2 is a plan view and a cross-sectional view of the longitudinally coupled resonator 32 which show the longitudinally coupled resonator 32. The example in FIG. 2 shows the basic structure of the longitudinally coupled resonator 32. The number of electrode fingers defining an electrode, the length of the electrode finger, and the like are not limited to those shown in FIG. 2.

The IDT electrode 34 includes a pair of comb-shaped electrodes 34a and 34b facing each other. The comb-shaped electrode 34a includes a plurality of electrode fingers 51a that are parallel or substantially parallel to each other and a busbar electrode 52a connecting the electrode fingers 51a. The comb-shaped electrode 34b includes a plurality of electrode fingers 51b that are parallel or substantially parallel to each other and a busbar electrode 52b connecting the electrode fingers 51b. The electrode fingers 51a and the electrode fingers 51b extend in a direction orthogonal or substantially orthogonal to an X-axis direction, which is an acoustic wave propagation direction, to interdigitate with each other.

A parameter that specifies the shape and size of the IDT electrode 34 is referred to as an electrode parameter. Examples of the electrode parameter include a wavelength λ that is the repetition period of the electrode finger 51a or 51b in the X-axis direction, an intersecting width L that is the length of an overlap between the electrode fingers 51a and 51b in the X-axis direction, a line width W of the electrode fingers 51a and 51b, and a space width S that is the width of space between the adjacent electrode fingers 51a and 51b.

Examples of the electrode parameter also include the number N of pairs of electrode fingers that is half of the total number of the electrode fingers 51a and 51b, a pitch (W+S) that is the repetition period of the combination of the electrode fingers 51a and 51b, and a metallization ratio W/(W+S) that is the ratio of a line width to a pitch.

The reflector 35 includes a plurality of electrode fingers 51c that are parallel or substantially parallel to each other and a busbar electrode 52c connecting one ends of the electrode fingers 51c and the other ends of the electrode fingers 51c. The electrode fingers 51c extend in a direction orthogonal or substantially orthogonal to the X-axis direction.

The electrode fingers 51a, 51b, and 51c and the busbar electrodes 52a, 52b, and 52c are defined by an electrode layer 53 on a piezoelectric layer 59.

The electrode layer 53 may be made of, for example, a metal such as copper or aluminum or the alloy thereof. The piezoelectric layer 59 may be made of, for example, a piezoelectric material including lithium tantalite or lithium niobate. The electrode layer 53 may be provided on the piezoelectric layer 59 via an adhesion layer (not shown). The piezoelectric layer 59 may be provided on a support substrate made of silicon. The piezoelectric layer 59 itself may be a support substrate. The piezoelectric layer 59 may have a layered structure in which two types of piezoelectric layers with different acoustic wave propagation speeds are laminated.

In the transmission filter 40, a signal to be supplied to the transmission filter circuit 10 branches off and is also supplied to the additional circuit 30. The signal supplied to the additional circuit 30 is subjected to phase rotation in the longitudinally coupled resonator 32 and amplitude adjustment in the capacitive elements 37 and 38 and is output as a cancellation signal that is in opposite or substantially opposite phase to a cancellation target signal passing through the transmission filter circuit 10 and preferably has the same or substantially the same amplitude as the cancellation target signal, for example.

When the amplitude of a result of the combination of the cancellation target signal and the cancellation signal is smaller than that of the cancellation target signal, the attenuation characteristics and isolation characteristics of the whole of the transmission filter 40 are significantly improved.

However, as described above, with the wider frequency band of a filter as a backdrop, a phase adjustment is difficult to perform in a target frequency band with the additional circuit 30. Adequate attenuation characteristics and adequate isolation characteristics are sometimes difficult to achieve.

In the preferred embodiment described above, instead of the additional circuit 30, an additional circuit 31 in which a capacitive element 36 is added is included to define a multiplexer.

Figure 3:
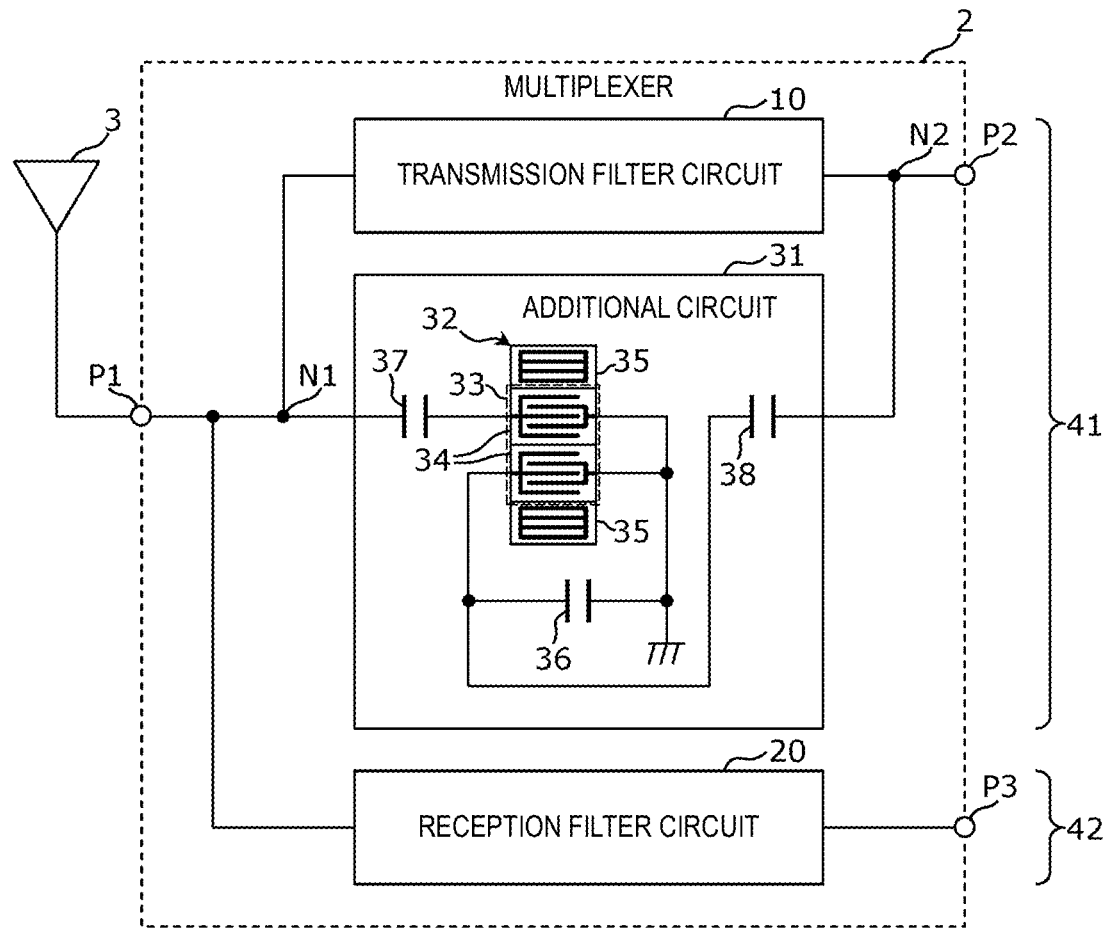
FIG. 3 is a block diagram showing a multiplexer according to a preferred embodiment of the present invention.

FIG. 3 is a block diagram showing a multiplexer according to a preferred embodiment of the present invention. A multiplexer 2 shown in FIG. 3 differs from the multiplexer 1 shown in FIG. 1 in that the capacitive element 36 is added in the additional circuit 31. The capacitive element 36 is connected between the ground and a signal path connecting the resonator group 33 and the capacitive element 38. The transmission filter circuit 10 and the additional circuit 31 define a transmission filter 41.

The capacitive element 38 is an example of a first capacitive element. The capacitive element 36 is an example of a second capacitive element. The capacitive element 37 may be the first capacitive element. Accordingly, the capacitive element 36 is connected between the ground and the signal path connecting the resonator group 33 and the capacitive element 37. The node N1 corresponds to the output end of the additional circuit 31. The node N2 corresponds to the input end of the additional circuit 31.

In the additional circuit 31, the amplitude of a generated cancellation signal is able to be controlled by not only the capacitive elements 37 and 38 but also the capacitive element 36. As a result, a cancellation signal is able to be generated, the amplitude of which is more effectively controlled as compared with a cancellation signal generated by the additional circuit 30 not including the capacitive element 36.

For example, in the additional circuit 30, the amplitude of a cancellation signal in a low-frequency region easily becomes insufficient under the influence of the amplitude characteristics of the capacitive elements 37 and 38 provided on the signal path. In contrast, in the additional circuit 31, a cancellation signal having flatter amplitude characteristics in a wider frequency region is able to be generated by combining the amplitude characteristics of the capacitive elements 37 and 38 on the signal path and the amplitude characteristics of the capacitive element 36 located between the signal path and the ground.

Thus, in the additional circuit 31 including the capacitive element 36, the appropriate adjustment of the amplitude of a cancellation signal is able to be easily performed and the effective attenuation of a cancellation target signal component is able to be easily performed. The transmission filter 41 having excellent attenuation characteristics is able to therefore be provided. By including the transmission filter 41 having excellent attenuation characteristics, the multiplexer 2 having excellent isolation between transmission and reception sides is able to be provided.

The entire the additional circuit 31 including the resonator group 33 and the reflector 35 defining the longitudinally coupled resonator 32 and the capacitive elements 36, 37, and 38 may be defined by an IDT electrode provided on a piezoelectric substrate. That is, the capacitive elements 36, 37, and 38 may be the capacitance component of an IDT electrode, for example. The ground electrode to which the resonator group 33 is connected and the ground electrode to which the capacitive element 36 is connected may be the same ground electrode on a piezoelectric substrate or different ground electrodes.

The additional circuit 31 significantly improving the characteristics of the transmission filter 41 and the multiplexer 2 was confirmed by simulation. A result of the simulation will be described based on the comparison with the transmission filter 40 and the multiplexer 1 each including the additional circuit 30.

As conditions under which the simulation was performed, the pass band of the transmission filters 40 and 41 was set to range from about 703 MHz to about 733 MHz and the pass band of the reception filter 42 was set to range from about 758 MHz to about 788 MHz. At that time, the frequency band of a signal component that is subjected to cancellation in the additional circuits 30 and 31 is the same or substantially the same as the pass band of the reception filter 42, that is, ranges from about 758 MHz to about 788 MHz.

The capacitance of the capacitive element 37 was set to about 0.25 pF and the capacitance of the capacitive element 38 was set to about 0.15 pF. As the electrode parameter of the IDT electrode 34, the intersecting width L was set to about 30 μm, the wavelength λ was set to about 4.720 μm, the metallization ratio W/(W+S) was set to about 0.5, and the number N of pairs of electrode fingers was set to about 4.5.

Under these conditions, a plurality of capacitances of the capacitive element 36 were set in the range of about 0 pF to about 5.0 pF and the bandpass characteristics between the terminals P1 and P2 in the transmission filters 40 and 41 and the isolation characteristics between the terminals P3 and P2 in the multiplexers 1 and 2 were provided.

Figure 4:
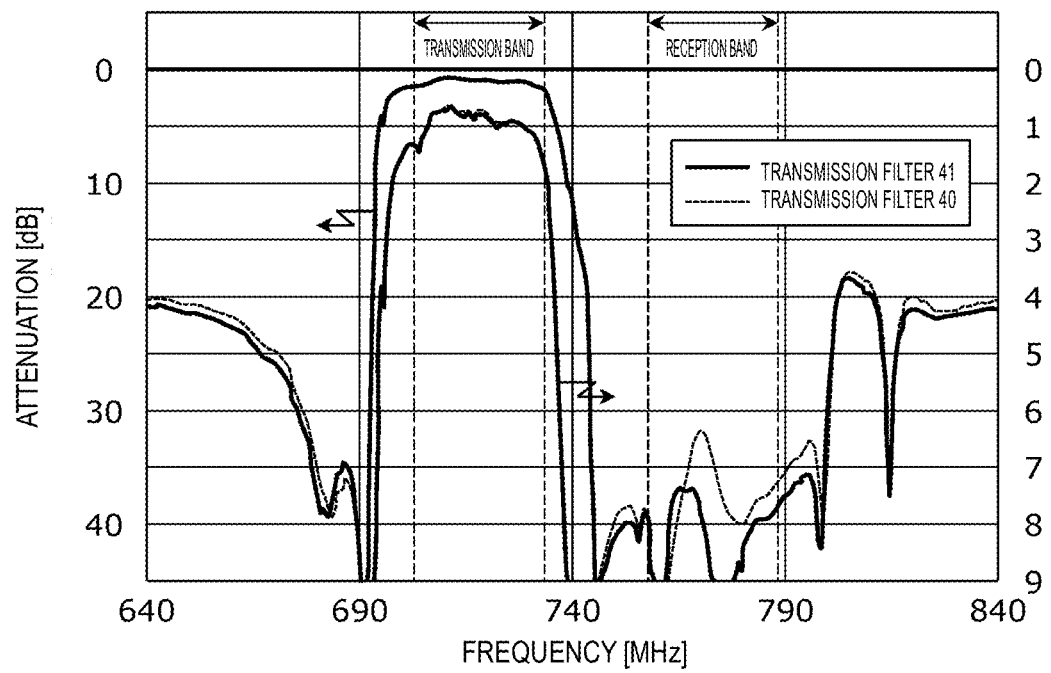
FIG. 4 is a graph showing bandpass characteristics of a transmission filter according to a preferred embodiment of the present invention and a transmission filter that is a comparative example.

FIG. 4 is a graph showing bandpass characteristics between the terminals P1 and P2 in the transmission filters 40 and 41. FIG. 4 shows bandpass characteristics when the capacitance of the capacitive element 36 is about 0.4 pF as a representative.

As shown in FIG. 4, the minimum value (worst value) of the attenuation in the reception band is about 37 dB in the transmission filter 41 and about 32 dB in the transmission filter 40. That is, the transmission filter 41 has more excellent attenuation characteristics in the cancellation band than the transmission filter 40.

Figure 5:
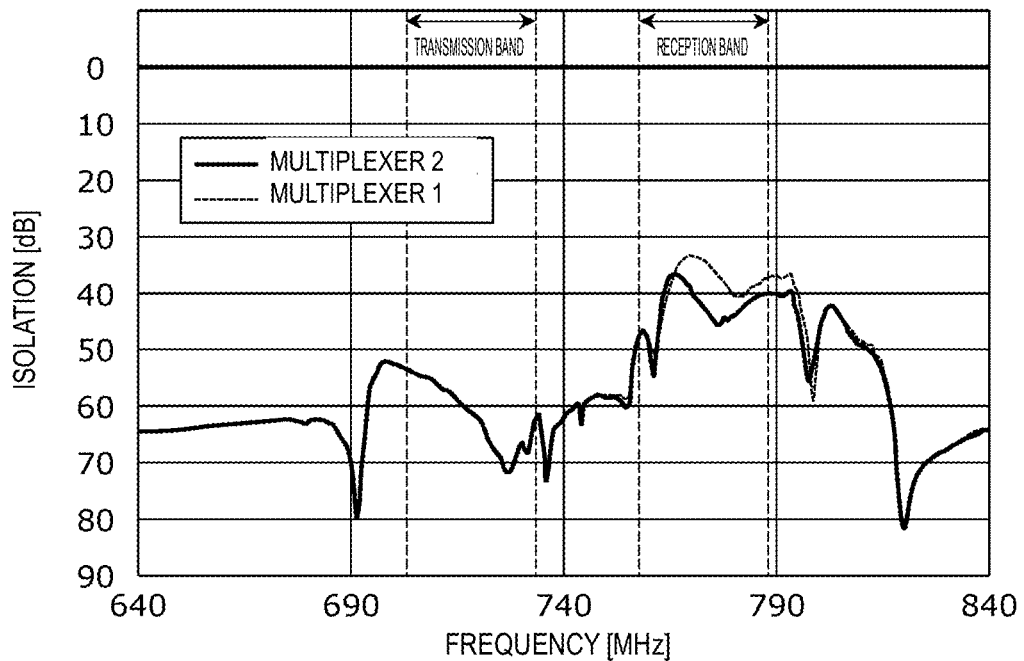
FIG. 5 is a graph showing isolation characteristics of a multiplexer according to a preferred embodiment of the present invention and a multiplexer that is a comparative example.

FIG. 5 is a graph showing isolation characteristics between the terminals P3 and P2 in the multiplexers 1 and 2. FIG. 5 shows isolation characteristics when the capacitance of the capacitive element 36 is about 0.4 pF as a representative.

As shown in FIG. 5, the minimum value (worst value) of the isolation between transmission and reception sides in the reception band is about 37 dB in the multiplexer 2 and about 33 dB in the multiplexer 1. That is, the multiplexer 2 has more excellent isolation characteristics in the cancellation band than the multiplexer 1.

Thus, it was found that, by including the additional circuit 31 in which the capacitive element 36 is added, the attenuation of the transmission filter 41 in the reception band and the isolation of the multiplexer 2 in the reception band could be significantly improved as compared with the case where the additional circuit 30 does not include the capacitive element 36.

Figure 6:
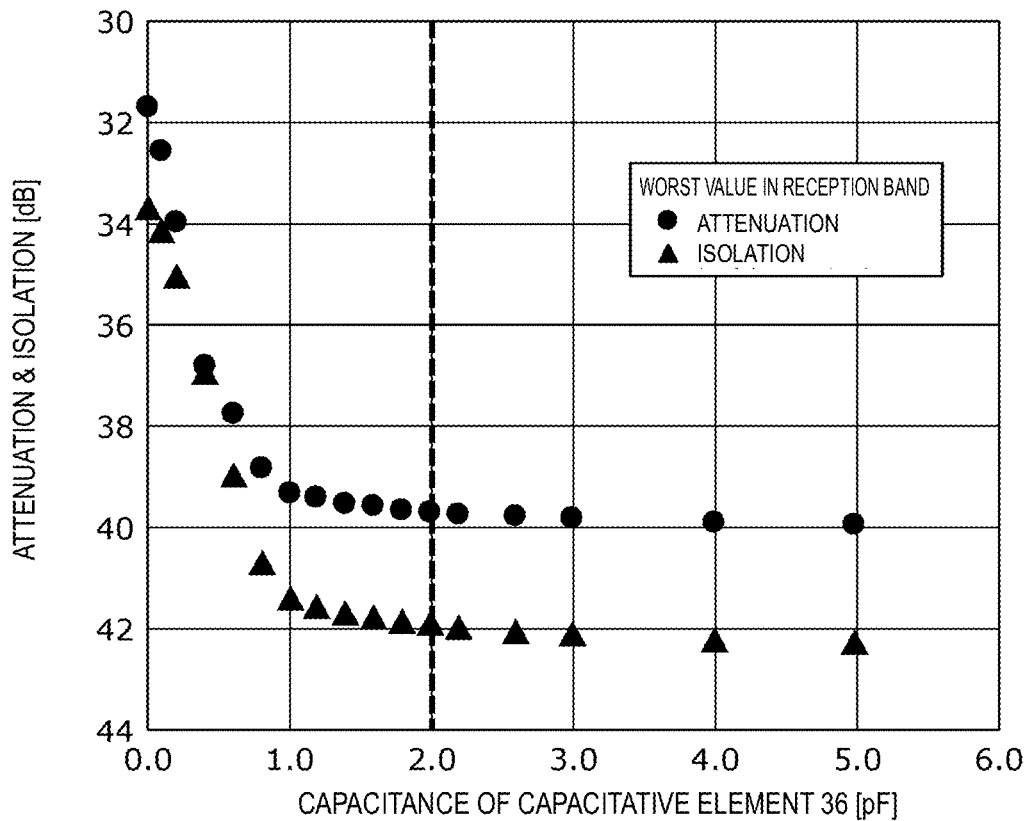
FIG. 6 is a graph showing a relationship of the capacitance of a capacitive element with bandpass characteristics and isolation characteristics according to a preferred embodiment of the present invention.

FIG. 6 is a graph showing a relationship of the capacitance of the capacitive element 36 with the bandpass characteristics between the terminals P1 and P2 and the isolation characteristics between the terminals P3 and P2. In FIG. 6, the minimum values (worst values) of the attenuation of the transmission filter 41 in the reception band and the minimum values (worst values) of the isolation of the multiplexer 2 in the reception band are plotted.

As is apparent from FIG. 6, the attenuation and the isolation are markedly increased (improved) in the range of the capacitance of the capacitive element 36 of greater than about 0 pF but less than or substantially equal to about 2.0 pF. In the range of the capacitance of the capacitive element 36 of greater than about 2.0 pF, the attenuation and the isolation converge to respective substantially constant values. That is, even if the capacitance of the capacitive element 36 is greater than about 2.0 pF, the attenuation and the isolation cannot be effectively improved in spite of the capacitive element 36 being increased in size.

Based on the result shown in FIG. 6, the preferred range of the capacitance of the capacitive element 36 is, for example, the range of greater than about 0 pF but less than or equal to about 2.0 pF.

Although a filter according to a preferred embodiment of the present invention and a multiplexer according to a preferred embodiment of the present invention have been described, the present invention is not limited to the preferred embodiments. Various modifications to the preferred embodiments that may be conceived by those skilled in the art, and elements and features in different preferred embodiments may be combined without departing from the teachings of the present invention may be included in the scope of one or more aspects of the present invention.

In the above preferred embodiment, the application of the present invention to a transmission filter in a duplexer has been described as an example. However, the present invention is able to be similarly applied to a reception filter in a duplexer or a single filter. The present invention may be applied to a filter in, for example, a diplexer, a triplexer, or a quadplexer that demultiplexes and multiplexes a plurality of signals in different frequency bands.

Preferred embodiments of the present invention are able to be widely applied to communication devices, for example, cellular phones as a filter and a multiplexer each including a cancellation circuit.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter comprising:
a filter circuit including an input and an output; and
an additional circuit electrically connected in parallel with the filter circuit; wherein
the additional circuit includes:
  a resonator group including a plurality of interdigital transducers, each including an input electrode and an output electrode, provided adjacent to or in a vicinity of each other in an acoustic wave propagation direction;
  a first capacitive element electrically connected between the input of the filter circuit and the input electrode of a first interdigital transducer of the plurality of interdigital transducers, and the output electrode of the first interdigital transducer connected to a ground; and
  a second capacitive element electrically connected between the input electrode of a second interdigital transducer of the plurality of interdigital transducers and the ground; and
a capacitance of the second capacitive element is greater than about 0 pF and less than or equal to about 2.0 pF.

2. The filter according to claim 1, wherein the first capacitive element is connected to the input of the filter circuit at an input end of the additional circuit.

3. The filter according to claim 1, wherein
the resonator group and the second capacitive element are provided on a piezoelectric substrate; and
the resonator group and the second capacitive element are electrically connected to different ground electrodes on the piezoelectric substrate.

4. The filter according to claim 1, wherein the resonator group defines a longitudinally coupled resonator.

5. A multiplexer comprising:
a first filter; and
a second filter; wherein
one end of the first filter is electrically connected to one end of the second filter; and
at least one of the first filter and the second filter is the filter according to claim 1.

6. The multiplexer according to claim 5, wherein the first capacitive element is connected to the input of the filter circuit at an input end of the additional circuit.

7. The multiplexer according to claim 5, wherein
the resonator group and the second capacitive element are provided on a piezoelectric substrate; and
the resonator group and the second capacitive element are electrically connected to different ground electrodes on the piezoelectric substrate.

8. The multiplexer according to claim 5, wherein the resonator group defines a longitudinally coupled resonator.

9. The multiplexer according to claim 5, wherein at least one of the first filter and the second filter is included in a reception filter circuit that is electrically connected to an antenna.

10. The multiplexer according to claim 5, further comprising:
a first terminal;
a second terminal; and
a third terminal; wherein
the first filter is provided between the first terminal and the second terminal; and
the second filter is provided between the first terminal and the third terminal.

11. The filter according to claim 1, wherein the filter circuit is an acoustic wave filter circuit including an acoustic wave resonator or an LC resonator filter.

12. The filter according to claim 1, wherein
the first interdigital transducer includes a first interdigital transducer electrode, and the second interdigital transducer includes a second interdigital transducer electrode;
a first end of the first interdigital transducer electrode is electrically connected to the first capacitive element, and a second end of the first interdigital transducer electrode is electrically connected to the ground; and
a first end of the second interdigital transducer electrode is electrically connected to the second capacitive element, and a second end of the second interdigital transducer electrode is electrically connected to the ground.

13. The filter according to claim 1, wherein the additional circuit further includes a first reflector and a second reflector that are provided on opposing sides of the resonator group in the acoustic wave propagation direction.

14. The filter according to claim 1, wherein a signal generated by the additional circuit has a phase that is opposite or substantially opposite to a phase of a signal generated by the filter circuit.

15. The filter according to claim 1, wherein a signal generated by the additional circuit has an amplitude that is opposite or substantially opposite to an amplitude of a signal generated by the filter circuit.

* * * * *